United States Patent [19]

Strack et al.

[11] Patent Number: 4,903,112

[45] Date of Patent: Feb. 20, 1990

[54] SEMICONDUCTOR COMPONENT WITH CONTACT HOLE

[75] Inventors: Helmut Strack, Munich; Gottfried Schuh, Augsburg, both of Fed. Rep. of Germany

[73] Assignee: Siemens Aktiengesellschaft, Berlin and Munich, Fed. Rep. of Germany

[21] Appl. No.: 212,365

[22] Filed: Jun. 22, 1988

Related U.S. Application Data

[63] Continuation-in-part of Ser. No. 924,105, Oct. 31, 1986, abandoned, which is a continuation of Ser. No. 556,499, Nov. 30, 1983, abandoned.

[30] Foreign Application Priority Data

Dec. 8, 1982 [DE] Fed. Rep. of Germany ....... 3245457

[51] Int. Cl.$^4$ ...................... H01L 29/06; H01L 29/78
[52] U.S. Cl. ...................... 357/55; 357/23.4; 357/23.9; 357/86
[58] Field of Search ...................... 357/23.4, 23.9, 55, 357/86

[56] References Cited

U.S. PATENT DOCUMENTS

| | | | |
|---|---|---|---|
| 3,969,745 | 7/1976 | Blocker | 357/55 |
| 4,143,384 | 3/1979 | Kim et al. | 357/55 |
| 4,194,933 | 3/1980 | Logan et al. | 357/38 |
| 4,200,968 | 5/1980 | Schroeder | 437/38 |
| 4,408,384 | 10/1983 | Lowis et al. | 357/20 |
| 4,417,385 | 11/1983 | Temple | 357/23.4 |
| 4,502,069 | 2/1985 | Schuh | 357/23.9 |
| 4,503,598 | 3/1985 | Vora et al. | 357/23.4 |
| 4,785,344 | 11/1988 | Franz | 357/91 |

FOREIGN PATENT DOCUMENTS 2362492 3/1978 France.

OTHER PUBLICATIONS

Physics and Technology of Semiconductor Devices, A. S. Grove; Wiley, New York; 1967; pp. Title, Copyright, 69–75.

Analog Integrated Circuit Design, A. B. Grebene; Van Nostrand, New York; 1972; pp. Title, Copyright, 4–21, 30, 108.

Analysis and Design of Analog Integrated Circuits, P. R. Gray and R. G. Meyer; Wiley, New York; 1977; pp. Title, Copyright, 73.

*Primary Examiner*—Rolf Hille
*Assistant Examiner*—Robert P. Limanek
*Attorney, Agent, or Firm*—Adel A. Ahmed

[57] ABSTRACT

A semiconductor component. The semiconductor component has two superimposed semiconductor layers of different conduction materials. An upper layer is provided with an opening through which a lower layer is exposed. A space saving scheme for connecting electrically the two layers is provided, by depositing a connecting layer which contacts the upper layer at an edge only and the lower layer is contacted at its depth where its doping material maximum is located. This requires a doping equal to or greater than $10^{19}$ cm$^{-3}$ for the upper layer, which is dependent on thickness.

6 Claims, 1 Drawing Sheet

SEMICONDUCTOR COMPONENT WITH CONTACT HOLE

CROSS-REFERENCE TO RELATED APPLICATION

This is a continuation-in-part of Ser. No. 924,105 filed Oct. 31, 1986, now abandoned being itself a continuation of Ser. No. 556,499 filed Nov. 30, 1983, now abandoned.

BACKGROUND OF THE INVENTION

The present invention relates to a semiconductor component, in particular to a semiconductor with an improved interlayer interconnect scheme.

The semiconductor is of the type in which:

(a) A semiconductor substrate contains a first layer of a first conduction material;

(b) above the first layer is a second layer of a second conduction material;

(c) the second layer is provided with an opening;

(d) the first layer has a depression under the opening;

(e) the first and second layers are interconnected electrically by a conducting layer; and (f) the conducting layer contacts the first layer in the depression and the second layer at the wall of the opening.

Such a semiconductor component is described U.S. Pat. No. 4,408,384 issued on Oct. 11, 1983 to Lewis et al. which is hereby incorporated by reference especially with reference to FIG. 9. This semiconductor component has a source contact which contacts the source zone, located on the substrate surface, at an opening, and also an epitaxial layer, located under this source zone, in a depression. The source zone opening and the depression in the epitaxial layer under it are produced jointly by anisotropic etching, through which a V-shaped groove is formed. The edges of the groove are aligned alongside the surfaces of the epitaxial layer. In order to establish good cotact between the relatively weakly doped epitaxial layer and the source zone, the epitaxial layer must be contacted over a relatively large area, i.e. to a great depth. Due to the physical characteristics of anisotropic etching, the process is associated with a relatively great loss of area on the surface of the semiconductor component.

SUMMARY OF THE INVENTION

It is an object of the present invention to provide an improved semiconductor component of the type described so that such a contact can be designed in a more spacesaving manner.

According to a preferred embodiment of the invention, an improvement is provided in a semiconductor component having a semiconductor substrate supporting a first layer of a first conductivity type material and further having a second layer of second conductivity type located above the first layer in which there is provided an opening through which the first layer is exposed. Furthermore, a depression is located in the first layer below the opening in the second layer. The first and second layers are interconnected through a conducting layer which contacts the first layer in the depression at the bottom of the depression and the second layer at the wall of the opening. The improvement is realized, when the first layer has a material doped with the concentration maximum a prescribed distance below the substrate surface measured in the direction perpendicular to the substrate surface and it further has a doping characteristic such that the maximum concentration is located at the bottom of the depression with the further proviso that the second layer has a doping concentration of equal to or greater than $10^{19}$ cm$^{-3}$.

In accordance with another preferred embodiment of the invention, a semiconductor component comprises a semiconductor substrate having an upper side and a first layer of a first conductivity type having upper and lower sides with a predetermined separation therebetween, the lower side being supported on the upper side of the semiconductor substrate. The first layer has a doping concentration exhibiting a maximum concentration at a depth below the upper side of the first layer, the depth being small compared with the predetermined separation. The upper side of the first layer has therein a depression having a bottom located substantially at the depth of the maximum concentration. The semiconductor component further comprises a second layer of conductivity type having a doping concentration greater than $10^{19}$ cm$^{-3}$ and being supported on the upper side of the first layer, the second layer having therein an opening to expose said depression and a conducting layer interconnecting the first and second layers, the conducting layer contacting the first layer at the depression and contacting the second layer at a wall of the opening.

According to a further embodiment of the invention, the opening of the second layer tapers down in a funnel shape towards the substrate.

A still further embodiment of the invention provides for the inclusion of an insulation layer which covers the surface of the second layer.

The present invention also discloses a method for producing a semiconductor component as described above. According to the method a photo resist mask is applied to the insulating layer, an opening smaller than the openings to be produced in the insulating layer and in the second layer is made in a photo resist mask; and the actual opening in the insulating layer is produced by a plasma or wet etching method while the opening in the second layer as well as the depression in the first layer are produced by plasma etching.

Other features and advantages of the invention will be apparent from the following description of the preferred embodiments and from the claims.

For full understanding of the present invention, reference should now be made to the following detailed description of the preferred embodiments of the invention and to the accompanying drawings.

DETAILED DESCRIPTION

Figure 1:
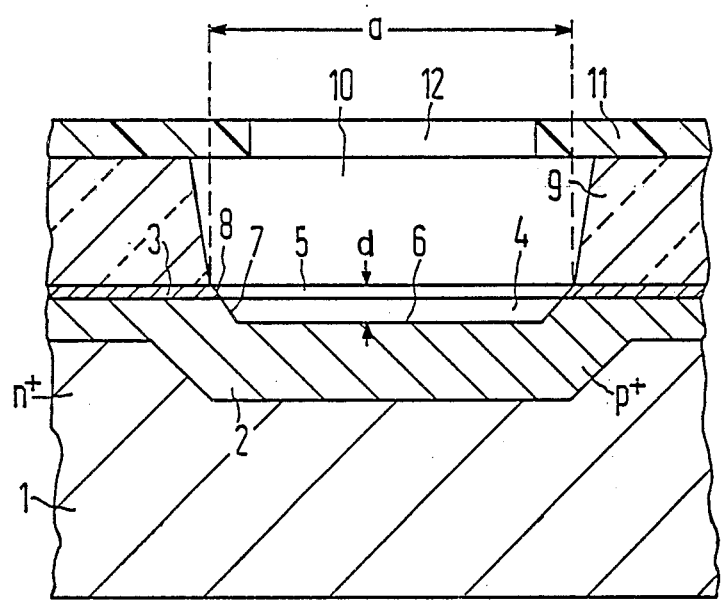
FIG. 1 provides a sectional view of a partially completed semiconductor component during a processing step in accordance with the preferred embodiments.

The invention is explained below by reference to FIGS. 1 and 2.

The semiconductor component has a semiconductor substrate 1 conductivity type a first layer 2 of a first conduction material. The layer may be heavily p-doped, for instance. Above the first layer 2 is a second layer 3 of an opposite conductivity type material, heavily n-doped, according to the present embodiment. The first layer 2 has a depression 4 while the second layer 3 is provided with an opening 5 of essentially the same cross-sectional area as the depression. The depression 4 is bounded by a bottom 6 parallel to the substrate surface located at the upper boundary of the second layer 3 and by sidewalls 7. The opening 5 is bounded by sidewalls 8. Above the second layer 3 at the substrate surface is an insulating layer 9 consisting of silicon dioxide, for example. This insulating layer has an opening 10.

The first layer 2 may be produced, for example, by ion implantation with subsequent diffusion. Both the ion implantation and the diffusion produce a material doping with a concentration which is maximum in the vicinity of the substrate surface. However, in ion implantation the maximum concentration is advantageously produced below the substrate surface and also below the external boundary of the very layer being implanted with ions. Now, as measured from the substrate surface, the depth d of the bottom 6 of opening 4 is located at least approximately in the depth of the doping maximum. Approximately a maximum deviation of ±20% of the maximum doping material concentration is understood to be present therein. The doping maximum and, hence, the depth d is usually under 1 $\mu$m, e.g. near 0.5 $\mu$m, at an ion implantation which is dependent on the energy of the implanted ions. This maximum may be $10^{18}$ atoms cm$^{-3}$.

The second layer 3 is expendiently produced by ion implantation also. The thickness of this layer may be under 0.5 $\mu$m or preferably near 0.2 $\mu$m. To obtain good contact and a good electrical connection between layers 2 and 3, layer 3 is doped to at least $10^{19}$, e.g. $2 \times 10^{20}$ atoms cm$^{-3}$. To increase the contact surface of layer 3, its sidewalls 8 may taper in funnel shape towards the substrate as shown.

The structure shown in FIG. 1 may be produced as follows:

The total area of layers 2 and 3 and the total area of the insulating layer 9 are covered by a photoresist layer 11 in which an opening 12 is made in the manner as known in the art. This opening 12 is smaller than the intended width "a" of the contact. Then the opening 10 in the insulating lyer 9 is made first by plasma or wet etching. The opening 5 in layer 3 and the depression 4 in layer 2 are made, as is known in the art, by plasma etching. In both etching operations, the overhang of the photo resist mask 11 ensures that the walls in the etched layers are inclined, preventing undercutting of layers 2 and 3. The first zone 1 is etched until bottom 6 is at least approximately at the depth of maximum doping concentration.

Figure 2:
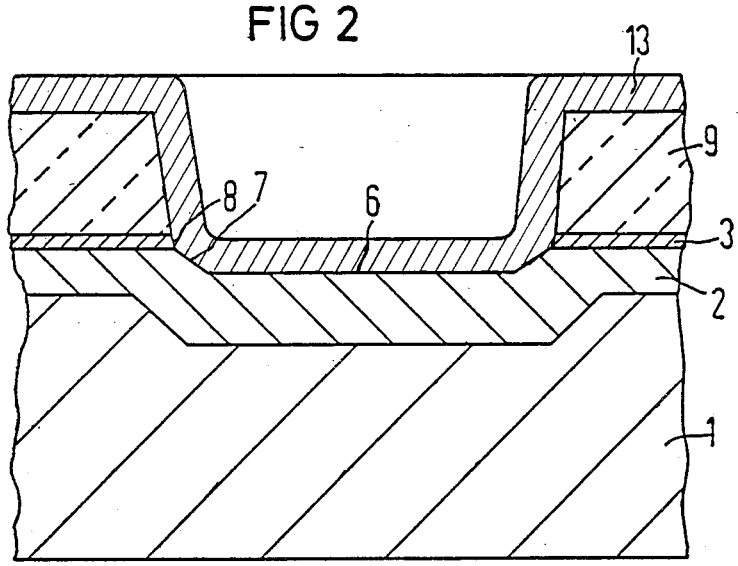
FIG. 2 shows a completed semiconductor component according to the invention.

After the removal of the photo resist mask 11 a conducting layer 13 such as of aluminum is deposited on the semiconductor component surface (FIG. 2). This layer contacts layer 3 at its sidewalls 8 and layer 2 at the bottom 6 and the sidewalls 7. Both layers are thus electrically contacted and interconnected. Due to the taper of the sidewall 7 of the depression in the second layer 2 small radii of curvature for the conducting layer 13 are avoided. The contact described can be made so as to save a large space.

There has thus been shown and described a novel semiconductor and a method therefor which fulfills all the objects and advantages sought therefor. Any changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A semiconductor component comprising:
    a semiconductor substrate having an upper side;
    a first layer of a first conductivity type having upper and lower sides with a predetermined separation therebetween, said lower side being supported on said upper side of said semiconductor substrate, said first layer having a doping concentration exhibiting a maximum concentration at a depth below said upper side of said first layer, said upper side of said first layer having therein a depression having a bottom located substantially at said depth of said maximum concentration;
    a second layer of a second conductivity type having a doping concentration greater than $10^{19}$ cm$^{-3}$ and being supported on said upper side of said first layer, said second layer having therein an opening to expose said depression; and
    a conducting layer interconnecting said first and second layers, said conducting layer contacting said first layer at said depression and contacting said second layer at a wall of said opening.

2. A semiconductor component according to claim 1, wherein said opening in said second layer tapers down in a funnel shape towards said substrate.

3. A semiconductor component according to claim 1, including an insulating layer covering a top surface of said second layer.

4. A semiconductor component according to claim 3, wherein said opening in said second layer tapers down in a funnel shape towards said substrate.

5. A semiconductor component according to claim 3, wherein said insulating layer has an opening therein above said opening in said second layer and wherein said opening in said insulating layer tapers down in a funnel shape towards said second layer.

6. A semiconductor component according to claim 4, wherein said insulating layer has an opening therein above said opening in said second layer and wherein said opening in said insulating layer tapers down in a funnel shape towards said second layer.

* * * * *